(12) United States Patent
Lowrey

(10) Patent No.: US 6,555,463 B2
(45) Date of Patent: *Apr. 29, 2003

(54) METHODS OF FABRICATING BURIED DIGIT LINES

(75) Inventor: Tyler A. Lowrey, Sand Point, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/032,730

(22) Filed: Dec. 28, 2001

(65) Prior Publication Data

US 2002/0068440 A1 Jun. 6, 2002

Related U.S. Application Data

(63) Continuation of application No. 09/650,797, filed on Aug. 30, 2000, now Pat. No. 6,372,629, which is a continuation of application No. 09/388,769, filed on Sep. 2, 1999, now Pat. No. 6,180,508.

(51) Int. Cl.[7] ........................................... H01L 21/4763
(52) U.S. Cl. ..................... 438/622; 438/626; 438/637; 438/672
(58) Field of Search ................... 438/618, 620, 438/621, 622, 626, 637, 672

(56) References Cited

U.S. PATENT DOCUMENTS

| | | |
|---|---|---|
| 5,198,384 A | 3/1993 | Dennison ..................... 438/3 |
| 5,270,236 A | 12/1993 | Rosner ........................ 438/637 |
| 5,283,208 A | 2/1994 | Lorsung et al. .............. 438/623 |
| 5,401,681 A | 3/1995 | Dennison .................... 438/253 |
| 5,605,857 A | 2/1997 | Jost et al. .................... 438/253 |
| 5,786,249 A | 7/1998 | Dennison .................... 438/241 |
| 5,879,986 A | 3/1999 | Sung ........................... 438/253 |
| 5,990,021 A | 11/1999 | Prall et al. ................... 438/745 |
| 6,180,508 B1 | 1/2001 | Lowrey ....................... 438/622 |
| 6,211,054 B1 | 4/2001 | Li et al. ....................... 438/618 |
| 6,329,686 B1 | 12/2001 | Lowrey et al. .............. 257/314 |
| 6,372,629 B1 * | 4/2002 | Lowrey ....................... 438/622 |

* cited by examiner

Primary Examiner—T. N. Quach
(74) Attorney, Agent, or Firm—TraskBritt

(57) ABSTRACT

A method for electrically linking the contacts of a semiconductor device to their corresponding digit lines includes disposing a quantity of mask material into a trench through which the contact is exposed. The mask also abuts a connect region of a conductive element of a corresponding conductive line and, therefore, protrudes somewhat over a surface of the semiconductor device. A layer of insulative material is formed over the semiconductor device with the mask exposed therethrough. The mask is then removed, leaving open cavities, including the trench and a strap region continuous with both the trench and a connect region of the corresponding conductive line. Conductive material is introduced into each open cavity to define conductive plugs or studs and conductive straps that are electrically isolated from one another. Semiconductor devices including features that have been fabricated in accordance with the method are also within the scope of the present invention.

22 Claims, 11 Drawing Sheets

METHODS OF FABRICATING BURIED DIGIT LINES

CROSS-REFERENCE TO RELATED APPLICATIONS

This application is a continuation of application Ser. No. 09/650,797, filed Aug. 30, 2000, now U.S. Pat. No. 6,372,629, which is a continuation of application Ser. No. 09/388,769, filed Sep. 2, 1999, now U.S. Pat. No. 6,180,508, issued Jan. 30, 2001.

BACKGROUND OF THE INVENTION

1. Field of the Invention

The present invention relates to methods of fabricating buried digit lines. Particularly, the present invention relates to a method of fabricating digit lines that are substantially free of stringers. More particularly, the present invention relates to a method of removing stringers from between the straps, plugs, and digit lines of semiconductor devices that include digit lines having widths of less than about 0.25 microns. The present invention also relates to semiconductor devices including buried digit lines that are substantially free of stringers and that have widths of less than about 0.25 microns.

2. Background of Related Art

Conventional semiconductor memory devices typically include an array of memory cells, each of which is in communication with a word line and a digit line. Due to the demand for semiconductor devices of ever-increasing density and ever-decreasing size, the semiconductor industry has sought ways to fabricate smaller, more compactly organized features. Thus, in semiconductor memory devices, the sizes of various features, as well as the spacing therebetween, have decreased. For example, the width of state of the art digit lines has decreased to about 0.25 microns or less. The spacing between adjacent digit lines has similarly decreased to about 0.30 microns or less.

Conventionally, photomask techniques, which typically employ visible to near infrared wavelengths of light, have been used to fabricate the digit lines of semiconductor memory devices. The sizes of features of such photomasks are, however, limited by the wavelengths of electromagnetic radiation employed to define these photomasks. As a result, the sizes and spacing of features defined either directly or indirectly by such photomasks are similarly limited.

Semiconductor memory devices that include digit lines having widths of less than about 0.25 microns and pitches of less than about 0.55 microns have been developed. The semiconductor memory devices, however, are relatively inefficient when compared with semiconductor memory devices having wider digit lines and pitches. The inefficiency of these more compact semiconductor memory devices is due, at least in part, to the potential for electrical shorts between adjacent digit lines. Electrical shorts in semiconductor memory devices with densely packed features may be caused by so-called "stringers" that remain following the definition of digit lines or other electrically conductive components, such as the plugs or straps that may be employed to link a contact to its corresponding digit line. The stringers may extend between adjacent structures or from a first structure to a location undesirably close to an adjacent, second structure. Thus, stringers may create an undesirable electrical path between adjacent digit lines.

Since semiconductor memory devices that include digit lines having widths of about 0.25 microns or less and digit line pitches of about 0.55 microns or less may include stringers that would likely cause electrical shorts between adjacent conductive structures, a significant percentage of the semiconductor memory devices will fail quality control testing. Consequently, fabrication costs are undesirably significantly increased.

Accordingly, there is a need for a method by which semiconductor memory devices that include digit lines with widths of less than about 0.25 microns and digit line pitches of less than about 0.55 microns may be more efficiently fabricated. There is a further need for a method of fabricating semiconductor memory devices of increased feature density which employs conventional techniques and equipment.

BRIEF SUMMARY OF THE INVENTION

The present invention includes a method of fabricating semiconductor memory devices that include digit lines having widths of less than about 0.25 microns and, more particularly, to a method of fabricating semiconductor memory devices having digit lines that are at most about 0.18 microns wide. Through use of the method of the present invention, a semiconductor memory device may include digit lines that are spaced less than about 0.30 microns apart and, more preferably, at most about 0.22 microns apart. Thus, semiconductor memory devices fabricated in accordance with the method of the present invention may have a digit line pitch of less than about 0.55 microns and, more preferably, a digit line pitch of at most about 0.40 microns. The present invention also includes semiconductor memory devices fabricated in accordance with the method of the present invention.

In accordance with the method of the present invention, a bit contact region of a semiconductor memory device, which is disposed between adjacent word lines of the semiconductor memory device, may be doped as known in the art to define a bit contact. If a bit contact was not formed prior to the fabrication of structures on the substrate, the bit contact region may be exposed by known processes, such as mask and etch techniques, and the bit contact region doped, as known in the art. Alternatively, the exposed bit contact region may be doped following definition of the digit lines. As the conductive elements of the word lines between which the bit contacts are disposed may be exposed during exposure of the bit contact regions of the semiconductor memory device, a layer of insulative material, such as silicon oxide, may be disposed over the semiconductor memory device and adjacent the exposed conductive elements of the word lines. The layer of insulative material may be patterned to fabricate sidewall spacers that electrically isolate the conductive elements of the word lines from the trench within which the bit contact is disposed.

A layer of silicon nitride may be disposed over the semiconductor memory device, including over the bit contacts thereof, by known techniques. Such a layer of silicon nitride may be subsequently employed as an etch stop layer.

Layers of digit line material, such as polysilicon and tungsten silicide ("$WSi_x$"), may be fabricated or otherwise disposed over the layer of silicon nitride by known processes. A layer of insulative material may be disposed over the layer of tungsten silicide. A mask, such as a photomask, including a plurality of mutually parallel elongate apertures therethrough, may be defined over the semiconductor memory device. The elongate apertures of the mask are preferably aligned over rows of bit contacts and substantially perpendicular to the underlying word lines of the semiconductor memory device. Preferably, the apertures of the mask have a width that facilitates the definition of digit lines that are spaced less than about 0.30 microns apart and, more preferably, that facilitates the definition of digit lines that are spaced at most about 0.22 microns apart from one another. The distance between adjacent apertures of the mask preferably facilitates the definition of digit lines having a width of less than about 0.25 microns from the digit line material and, more preferably, facilitates the definition of digit lines that have a width of at most about 0.18 microns.

Digit lines may be defined through the mask by known etching processes. The etchants employed to define the digit lines may be selected based on their ability to remove the digit line material or materials. If a layer of insulative material was disposed over one of the layers of digit line material, a first etchant is preferably selected to etch the insulative material. Preferably, an etchant that will remove the silicon nitride etch stop layer is also employed to expose the bit contact regions. Preferably, isotropic wet etch processes are employed to facilitate the removal of electrically conductive stringers from between adjacent digit lines. As the digit lines are defined, digit line materials are removed from above the bit contact regions. If the use of a photomask is desired, two masks may be employed in these patterning processes so as to prevent distortion of the photomasks. A first mask could be employed to define the digit lines and cover the peripheries of the dice. A second mask could be employed to protect the digit lines and to remove any insulative material, digit line material or materials, and silicon nitride from the peripheries of the dice.

One or more layers of insulative material, such as silicon oxide, may be disposed or grown over the digit lines. If the layer or layers of insulative material are deposited onto the semiconductor memory device, such as by tetraethylorthosilicate ("TEOS") deposition techniques, another mask may be employed to define sidewall spacers adjacent the sides of each of the digit lines. Of course, the mask would be employed in combination with an etchant known to etch the insulative material in order to define the sidewall spacers therefrom. As the layer of insulative material may also cover bit contacts and any adjacent exposed conductive traces of word lines, sidewall spacers for the word lines may also be defined from the layer of insulative material. These sidewall spacers will serve to insulate the word lines from a stud or plug of conductive material to be disposed between the bit contacts and their corresponding digit lines.

Another mask may be employed to shield the bit contacts and the strap regions of the semiconductor memory device, which are disposed between the trenches within which the bit contacts are located and the digit lines that correspond to each of the bit contacts. This mask preferably abuts an exposed portion of a conductive element of a corresponding digit line. As the mask extends across the strap regions of the semiconductor memory device, the mask may protrude from the trenches and, therefore, from a surface of the semiconductor memory device. Preferably, a photomask is employed. Photoresist may be disposed over the surface of the semiconductor memory device and selected regions thereof exposed and developed to define a photomask. Due to the small dimensions of features such as the digit lines of the semiconductor memory device, and due to small dimensional tolerances, proper alignment of the mask is critical to the operability of the semiconductor memory device. Preferably, the photomask is hard-baked so as to facilitate the fabrication of features of desired shapes and dimensions.

A layer of insulative material may be disposed over the surface of the semiconductor memory device, including over regions of the semiconductor memory device that are covered by the photomask. Preferably, this layer of insulative material comprises silicon oxide. Thus, the layer of insulative material may be deposited onto the surface of the semiconductor device by known processes, such as by tetraethylorthosilicate ("TEOS") wet dip or other TEOS deposition processes. Preferably, the photomask is exposed through the layer of insulative material. If a TEOS wet dip is employed, the surface of the TEOS layer is preferably substantially planar and disposed in a thickness so that the photomask may be exposed through the TEOS layer. Alternatively, regions of a TEOS layer that overlie the photomask may be removed therefrom by known techniques, such as planarization (e.g., chemical-mechanical planarization or chemical-mechanical polishing ("CMP")) techniques or mask and etch processes. As another alternative, the TEOS deposition process disclosed in U.S. Pat. No. 5,354,715, which issued to Wang et al. on Oct. 11, 1994, the disclosure of which is hereby incorporated in its entirety by this reference, may be employed to fabricate a layer of insulative material through which the photomask may be exposed.

The photomask may then be removed by known techniques. The semiconductor memory device may also be masked or otherwise cleaned.

Another layer of electrically conductive material, such as polysilicon, may be disposed over the semiconductor memory device within at least the strap regions thereof and in contact with at least the bit contacts thereof. A blanket isotropic etch-back of a type known in the art may be employed to reduce the height of the layer of conductive material—preferably to about or just below the height of the digit lines. As electrically conductive studs and straps, which establish electrical communication between the bit contacts and their corresponding digit lines, are to be defined from this layer of electrically conductive material, another mask may be disposed over the semiconductor memory device to facilitate the substantial removal of any remaining conductive material or features from between adjacent conductive structures that are to be isolated from one another, as well as the definition of these features from the electrically conductive layer. Accordingly, the mask preferably shields quantities of electrically conductive material disposed over the bit contacts, which quantities of electrically conductive material are referred to herein as studs or plugs, as well as regions of the electrically conductive material within the strap regions. All other regions of the semiconductor memory device and, thus, the layer of electrically conductive material may be exposed through the mask. Electrically conductive material may be removed through the mask as known in the art, such as by the use of etchants. Preferably, the electrically conductive material exposed through these apertures is first etched with an anisotropic etchant, then with an isotropic etchant. The anisotropic etchant facilitates the definition of studs and straps of desired dimensions and removes any electrically conductive material between these features. The isotropic etchant further facilitates the substantial removal of any electrically conductive stringers that may remain from either the layer of electrically conductive material from which the studs and straps were defined or that may remain from the layer of digit line material from which the digit lines were defined.

A layer of insulative material, such as a silicon oxide, a glass, or silicon nitride, may be disposed over the semiconductor memory device, as known in the art, to insulate the exposed studs and straps. Additional structures may be fabricated over the digit lines of the semiconductor memory device.

Other features and advantages of the present invention will become apparent to those of ordinary skill in the art through a consideration of the ensuing description, the accompanying drawings, and the appended claims.

DETAILED DESCRIPTION OF THE INVENTION

Figure 1A:
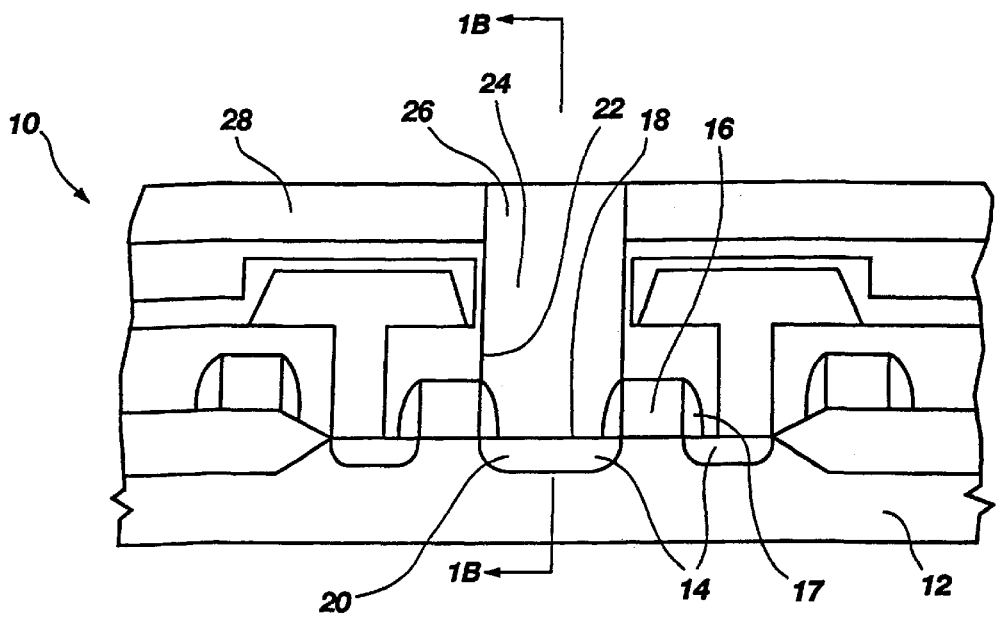
FIG. 1A is a schematic cross-sectional representation of a semiconductor memory device according to the present invention and fabricated in accordance with the method of the present invention.
Figure 1B:
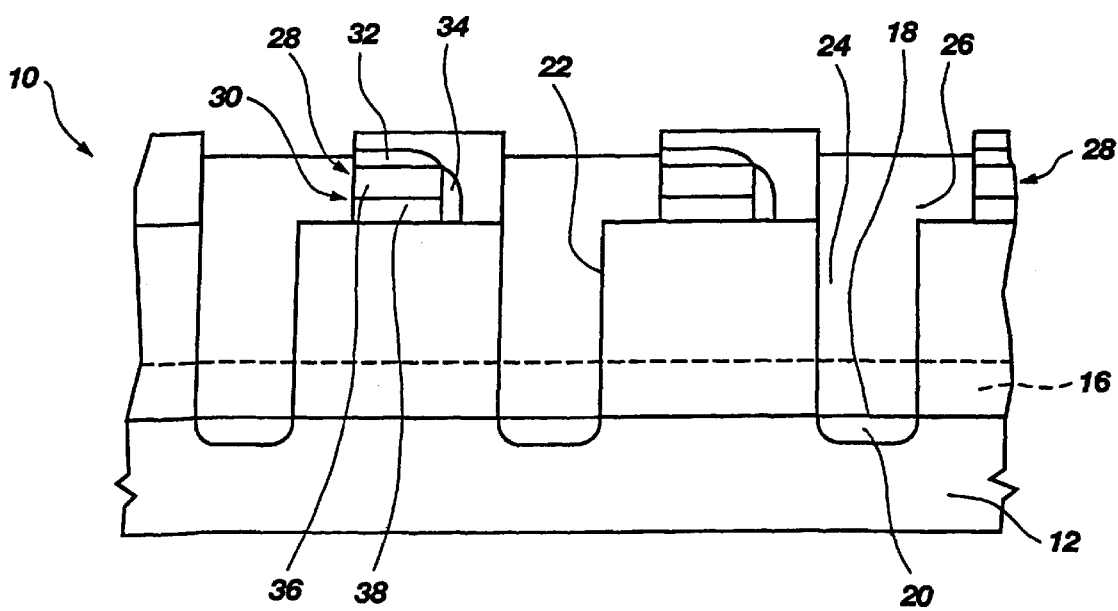
FIG. 1B is a schematic cross-sectional representation of the semiconductor memory device of FIG. 1A, taken along the plane of line 1B—1B, which extends perpendicularly through the plane of the page.

With reference to FIGS. 1A and 1B, a semiconductor memory device 10 according to the present invention is illustrated. Semiconductor memory device 10, which is also referred to herein as a semiconductor device, includes a substrate 12 including an array of conductively doped regions 14 therein. Preferably, substrate 12 comprises a p-type semiconductor material. Doped regions 14 preferably comprise an n-type semiconductor material and may, therefore, also be referred to herein as n-wells. Word lines 16 extend across a surface of substrate 12 in a substantially mutually parallel relationship to one another. The regions of substrate 12 disposed between adjacent word lines 16 are referred to as bit contact regions 18.

Bit contact regions 18 that are doped (i.e., comprise doped regions 14 of substrate 12) are referred to as bit contacts 20. Bit contact regions 18 or the bit contacts 20 thereof are exposed to a surface of semiconductor memory device 10 by means of a trench 22 aligned between adjacent word lines 16. Sidewall spacers 17, which are disposed adjacent word lines 16, electrically isolate the conductive elements of word lines 16 from the adjacent trench 22. A plug 24 of conductive material disposed within trench 22 and an adjacent strap 26 of conductive material provide an electrically conductive link between bit contact 20 and a corresponding digit line 28 that extends across semiconductor memory device 10 substantially perpendicularly to word lines 16.

Each digit line 28 preferably includes a conductive element 30, an insulative cap 32 disposed over conductive element 30, and a sidewall spacer 34 disposed laterally adjacent conductive element 30 and opposite strap 26. The conductive element 30 of each digit line 28 preferably includes a metal silicide layer 36 and a conductive layer 38 disposed over metal silicide layer 36. Conductive layer 38 preferably comprises polysilicon.

Preferably, digit lines 28 have a width of less than about 0.25 microns and, more preferably, of at most about 0.18 microns. Adjacent digit lines 28 are preferably spaced less than about 0.30 microns apart from one another and, more preferably, at most about 0.22 microns apart from one another. Thus, digit lines 28 preferably have a pitch of less than about 0.55 microns and, more preferably, of at most about 0.40 microns.

Turning now to FIGS. 2–16, a method is illustrated by which digit lines 28 (see FIGS. 1A and 1B) of a desired thickness and pitch may be fabricated upon and in communication with corresponding bit contacts 20 of a semiconductor memory device 10.

Figure 2:
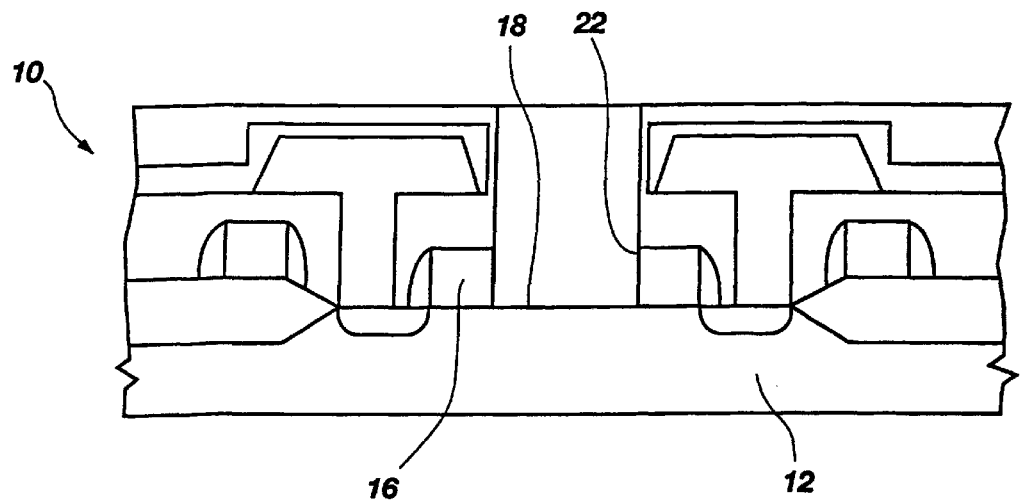
FIGS. 2–16 are schematic representations that illustrate an embodiment of the method of the present invention.

With reference to FIG. 2, a semiconductor memory device 10, which includes a trench 22 through which a bit contact region 18 is exposed, is illustrated. The conductive elements of the word lines 16 of semiconductor memory device 10 that are adjacent bit contact region 18 are exposed to trench 22. Trench 22 may be defined by known processes, such as mask and etch techniques, in order to expose bit contact region 18.

Figure 3:
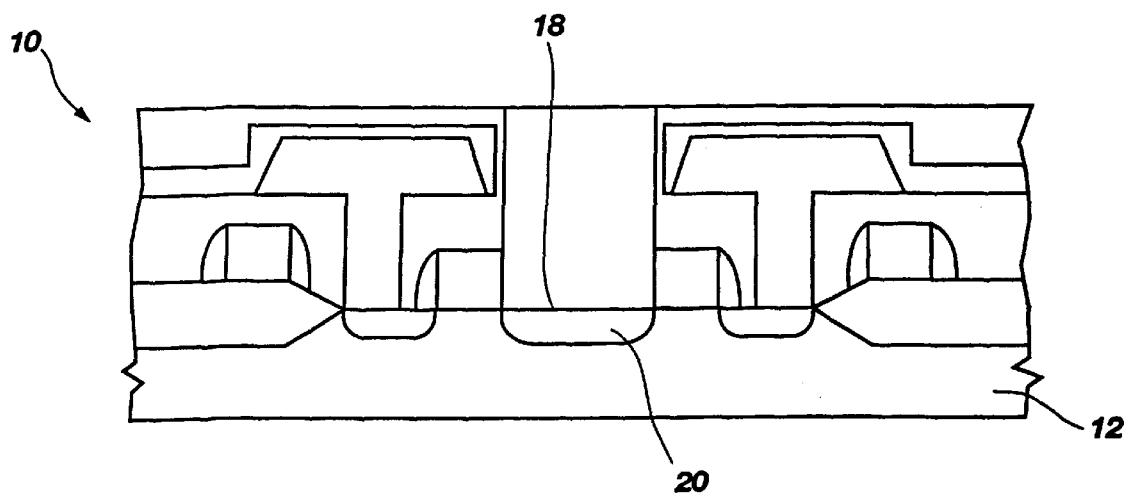

As shown in FIG. 3, if bit contact region 18 of substrate 12 has not been doped, bit contact region 18 may be doped by known processes, such as by implanting bit contact region 18 with arsenic. Alternatively, bit contact region 18 may be doped after digit lines 28 (see FIGS. 1A and 1B) have been fabricated and prior to fabricating plug 24 or strap 26 (see FIGS. 1A and 1B).

Figure 4:
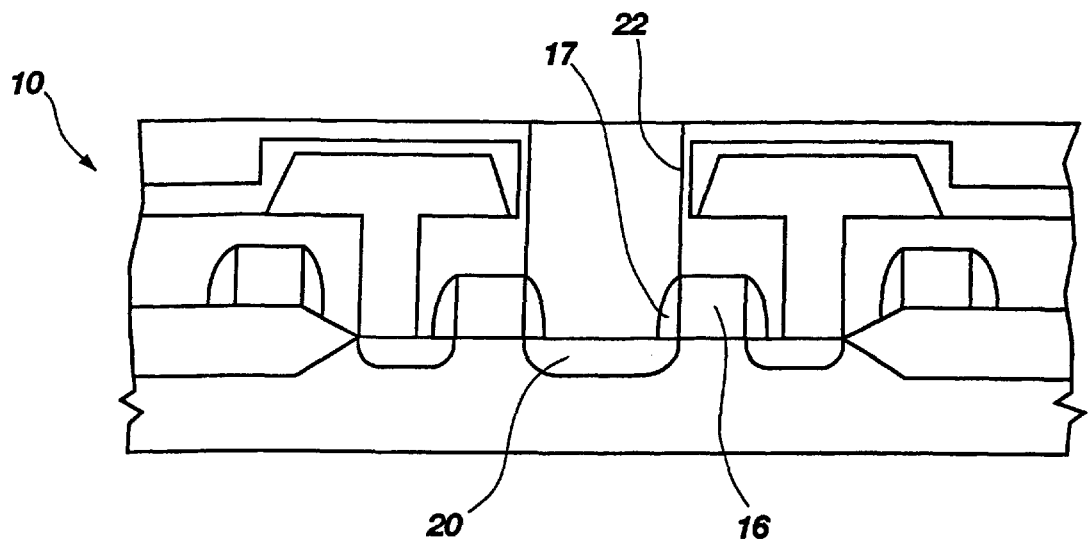

As illustrated in FIG. 4, any portions of the conductive elements of word lines 16 that are exposed to trench 22 may be electrically isolated from trench 22 by means of sidewall spacers 17. Of course, sidewall spacers 17 may be fabricated as known in the art, such as by exposing the conductive material of word lines 16 to an oxidizing temperature, or by disposing a known oxidizing material in contact therewith, or by disposing an insulative material adjacent the conductive material of word lines 16 and patterning the insulative material to define sidewall spacers 17 therefrom.

Figure 5:
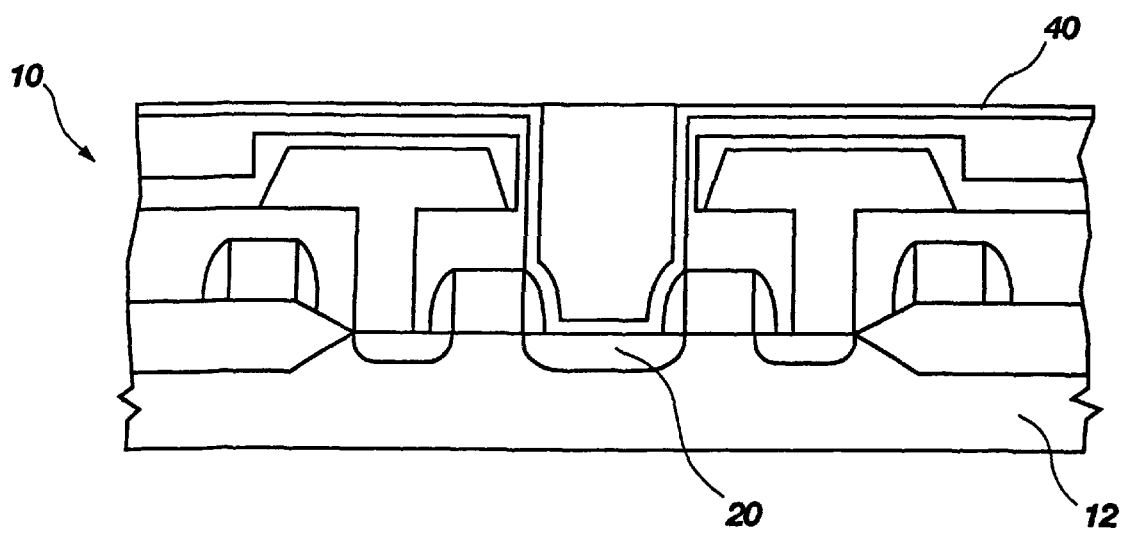

Referring to FIG. 5, a layer 40 of silicon nitride may be disposed over a surface of semiconductor memory device 10. Preferably layer 40 of silicon nitride is disposed substantially over the surface of semiconductor memory device 10, including the bit contacts 20 thereof. Layer 40 may be fabricated as known in the art, such as by chemical vapor depositing ("CVD") silicon nitride over the surface on semiconductor memory device 10. Such a silicon nitride layer 40 may subsequently be employed as an etch stop.

Figure 6:
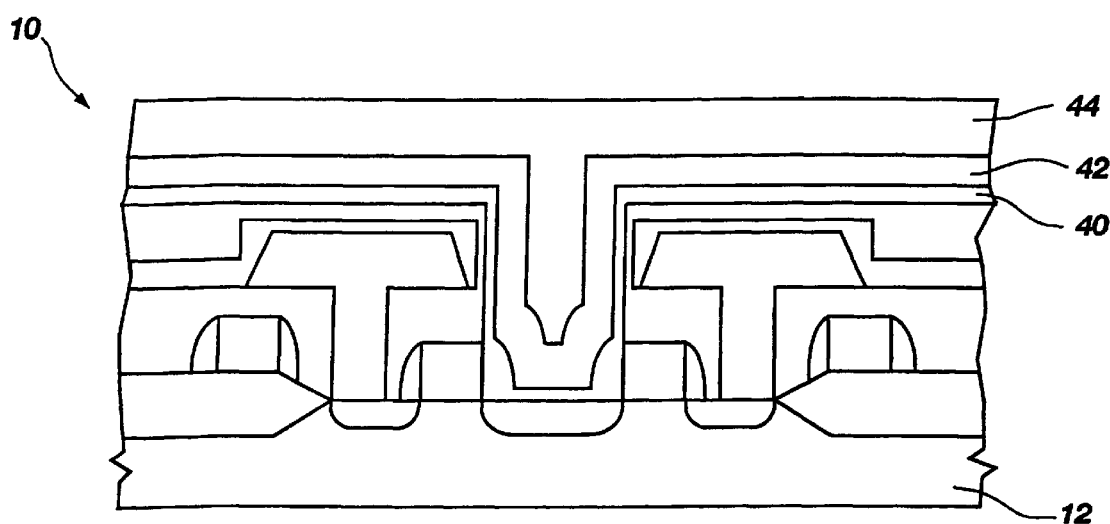

Turning to FIG. 6, one or more layers of digit line material or materials may be disposed over the surface of semiconductor memory device 10. As illustrated, a first digit line layer 42 may comprise a metal silicide. Preferably, first digit line layer 42 comprises a refractory metal silicide, such as titanium silicide, tantalum silicide, cobalt silicide, or tungsten silicide. First digit line layer 42 may be fabricated as known in the art, such as by chemical vapor deposition or by fabricating adjacent layers of silicon and metal and annealing these layers to one another.

A second digit line layer 44 may be disposed over first digit line layer 42. Second digit line layer 44 preferably comprises an electrically conductive material, such as a metal or polysilicon. Second digit line layer 44 may be fabricated as known in the art, such as by chemical vapor deposition or physical vapor deposition ("PVD").

Figure 7:
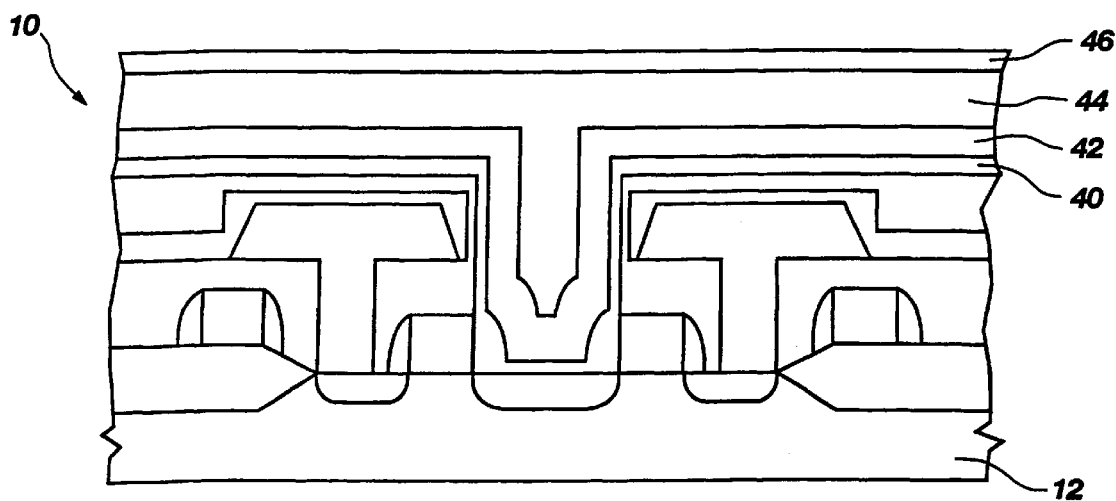

With reference to FIG. 7, an insulative layer 46 may be disposed over the layer or layers of digit line material. As shown, insulative layer 46 is disposed over second digit line layer 44. Insulative layer 46 may be fabricated as known in the art, such as by oxidizing an underlying layer 42 or 44 of digit line material or by disposing an electrically insulative material over layer 44 of digit line material by chemical vapor deposition, spin-on-glass ("SOG"), or other known processes. As digit lines 28 are defined through the layer or layers of digit line material, insulative layer 46 may be employed as an insulative cap 32 (see FIGS. 1A and 1B) over each of the digit lines 28.

Figure 8:
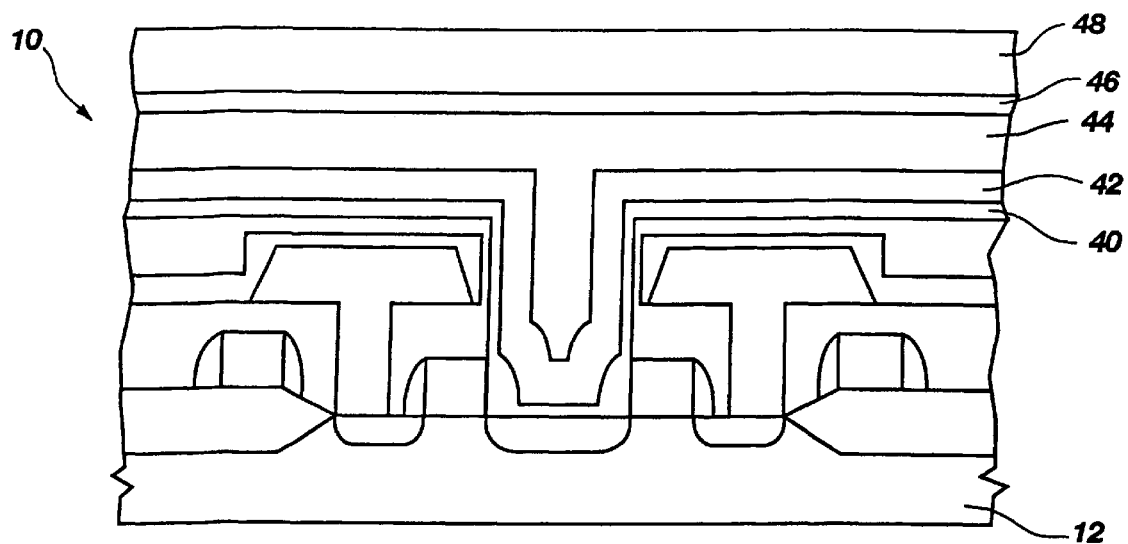
Figure 8A:
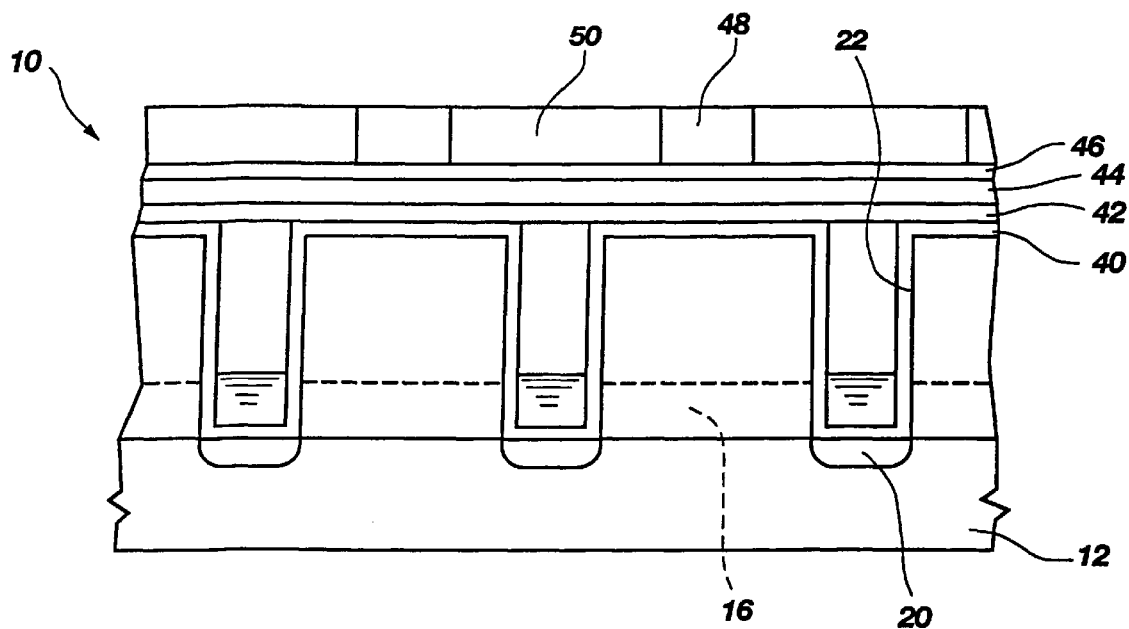
Figure 8B:
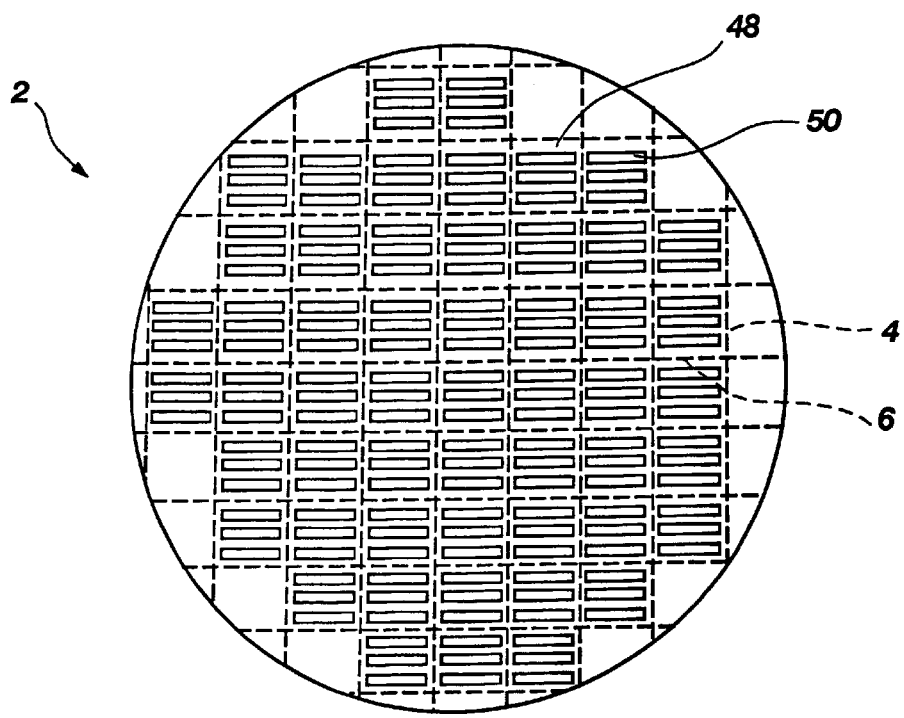

Referring now to FIGS. 8–8B, a first mask 48 may be disposed over the uppermost layer 44 of digit line material. As shown in FIG. 8A, mask 48 includes a plurality of mutually parallel apertures 50 that are alignable over trenches 22 and bit contacts 20. As illustrated, mask 48 shields elongated areas of semiconductor memory device 10, over which digit lines 28 are to be defined. As shown in FIG. 8B, mask 48 also preferably shields the periphery 6 of each die 4 of a wafer 2 that includes a plurality of dice 4. Although mask 48 may be fabricated by any known process, the use of photomask technology is preferred. When a photomask is employed as mask 48, a photoresist may be disposed over a surface of semiconductor memory device 10 by known processes, such as by spinning the photoresist onto semiconductor memory device 10, and the layer of photoresist exposed and developed as known in the art.

Figure 9:
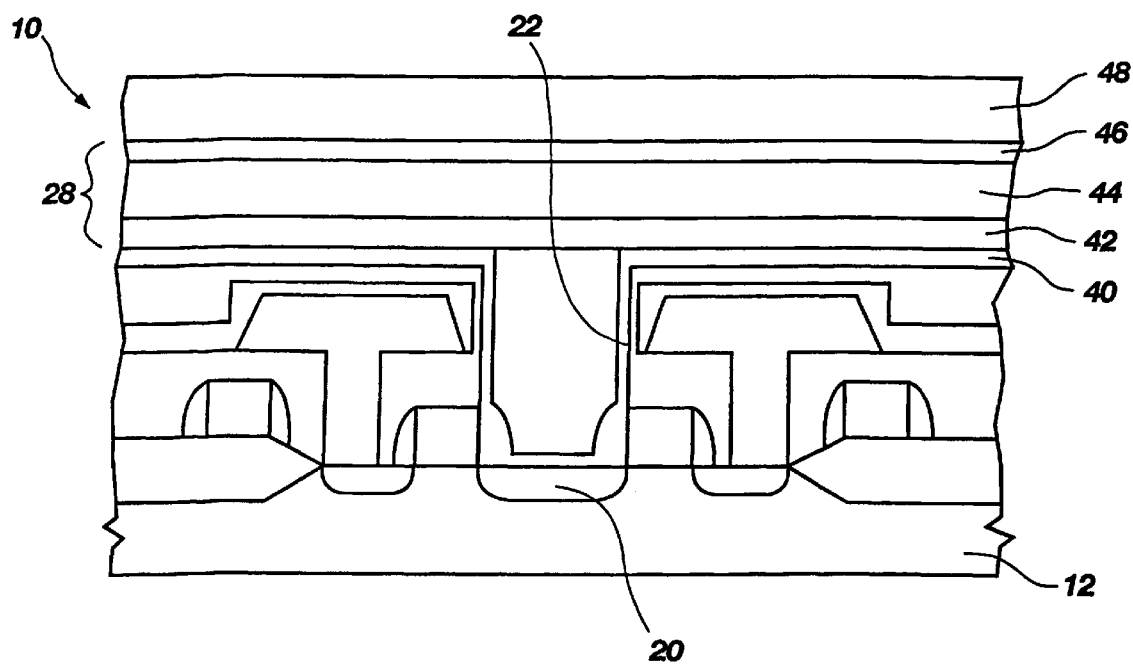
Figure 9A:
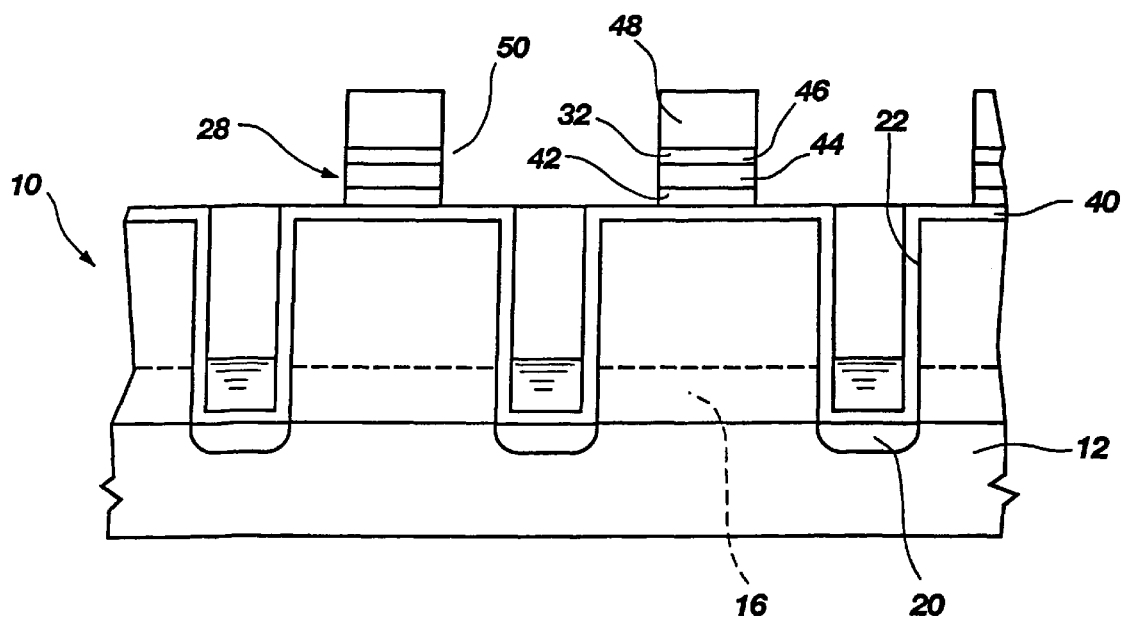
Figure 10:
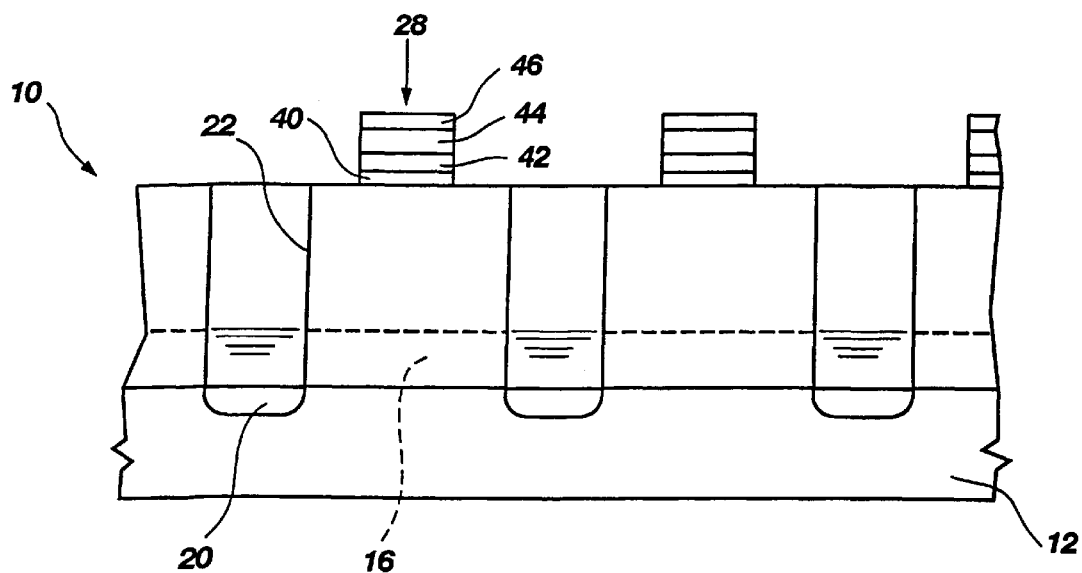

With reference to FIGS. 9 and 9A, digit lines 28 may be defined through mask 48. Known patterning processes may be employed to define digit lines 28 and their overlying insulative caps 32. Preferably, one or more isotropic etchants are employed to remove the materials of insulative layer 46, second digit line layer 44, and first digit line layer 42 either directly or indirectly (i.e., through apertures formed through an overlying layer) through apertures 50 of mask 48. With reference to FIG. 10, the underlying layer 40 of silicon nitride may also be removed by known processes, such as by the use of an isotropic etchant.

Figure 9B:
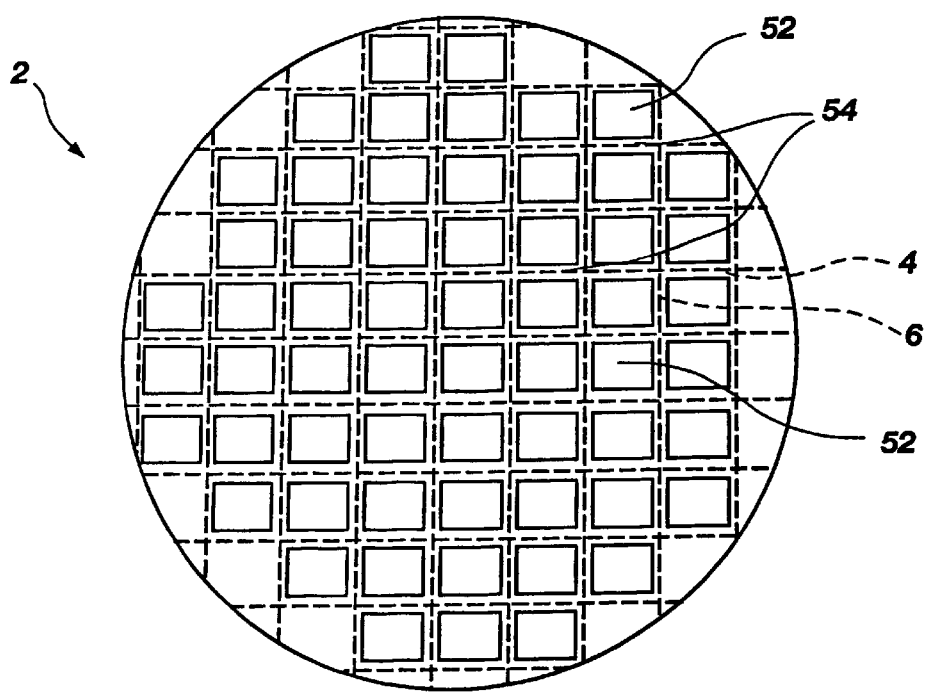

With reference to FIG. 9B, if a first mask 48 that shielded the peripheries of dice 4 (see FIG. 8B) was employed, a second mask 52 may be employed to remove any regions of insulative layer 46, second digit line layer 44, first digit line layer 42, or layer 40 of silicon nitride that remain at the peripheries 6 of dice 4. Preferably, mask 52 substantially shields digit lines 28 and other features of semiconductor memory device 10, which are collectively referred to herein as a central region of the semiconductor memory device, and includes apertures 54 that expose the peripheries 6 of dice 4. Mask 52 may be disposed upon semiconductor memory device 10 and defined as known in the art, such as by the use of photomask techniques. Any digit line materials, insulative materials, or silicon nitride that remain on the peripheries 6 of dice 4 may be removed either directly or indirectly through mask 52 by known processes, such as by the use of etchants. The masks 48 and 52 may each be removed from semiconductor memory device 10 by known processes.

Referring to FIG. 10, upon removing layer 40 of silicon nitride, bit contact regions 18 are again exposed through trenches 22. Portions of sidewall spacers 17 may also be removed as layer 40 is removed. Accordingly, it may be necessary to re-isolate the conductive elements of word lines 16 from their corresponding trench 22. Again, known processes may be employed to fabricate sidewall spacers 17 adjacent the conductive elements of word lines 16.

Since bit contact regions 18 of substrate 12 are again exposed through their corresponding trench 22, bit contact regions 18 may be conductively doped, as known in the art, to form bit contacts 20 if such doping was not previously performed.

Figure 11:
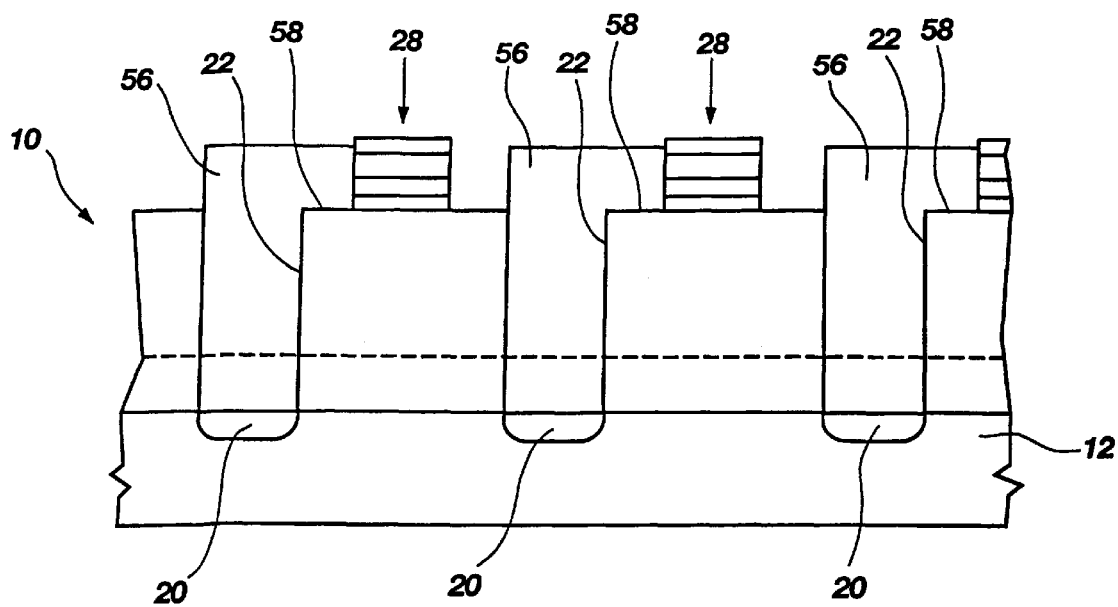

Referring now to FIG. 11, another mask 56 may be disposed over semiconductor memory device 10. Preferably, mask 56 comprises a photomask, which may be defined by known processes, such as by disposing a photoresist over semiconductor memory device 10 and exposing and developing selected regions of the photoresist. Mask 56 preferably substantially fills each of the trenches 22 of semiconductor memory device 10 and, thereby, shields bit contacts 20. Mask 56 also extends laterally over a strap region 58 of the semiconductor memory device 10. Each strap region 58 is disposed between a trench 22 and its corresponding digit line 28. Thus, mask 56 may protrude from trench 22 and somewhat from the surface of semiconductor memory device 10. Preferably, mask 56 contacts an exposed, electrically conductive lateral edge portion of the adjacent digit line 28. Mask 56 is preferably hard-baked, as known in the art, to facilitate the fabrication of structures (i.e., conductive plugs and straps) having the desired dimensions and configurations.

Figure 12:
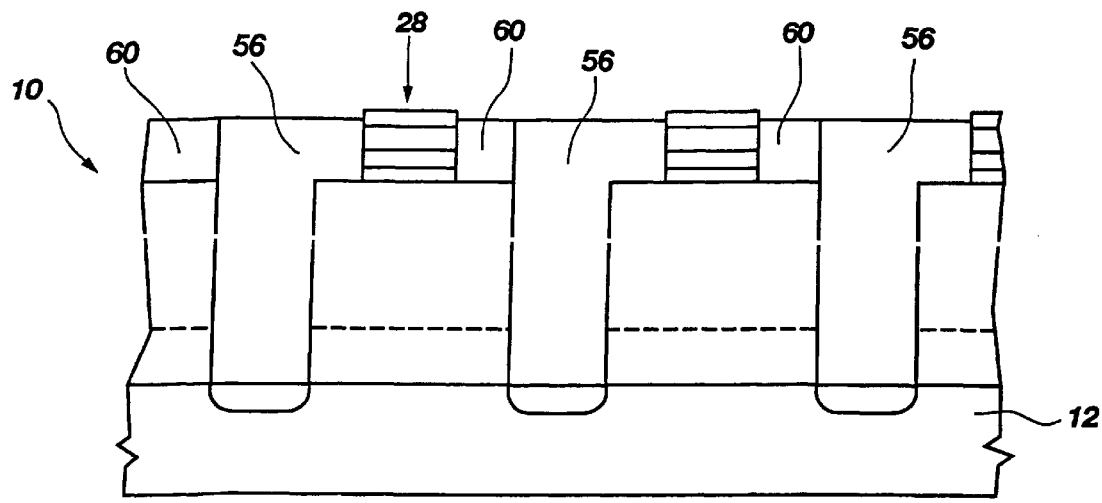

Turning to FIG. 12, another layer 60 of insulative material may be disposed over semiconductor memory device 10. Preferably, mask 56 is exposed through layer 60 of insulative material. Layer 60 preferably has a substantially planar surface. Accordingly, layer 60 may be fabricated by known tetraethylorthosilicate ("TEOS") wet dip processes. Alternatively, layer 60 of insulative material may be deposited over semiconductor memory device 10 by known processes, such as by chemical vapor deposition or spin-on processes. Mask 56 may then be exposed through layer 60 by known processes, such as by planarizing layer 60 (e.g., by chemical-mechanical planarization ("CMP")) or by employing a blanket isotropic etch-back. Layer 60 preferably insulates the exposed lateral edges of digit lines 28, and may cover digit lines 28.

Figure 13:
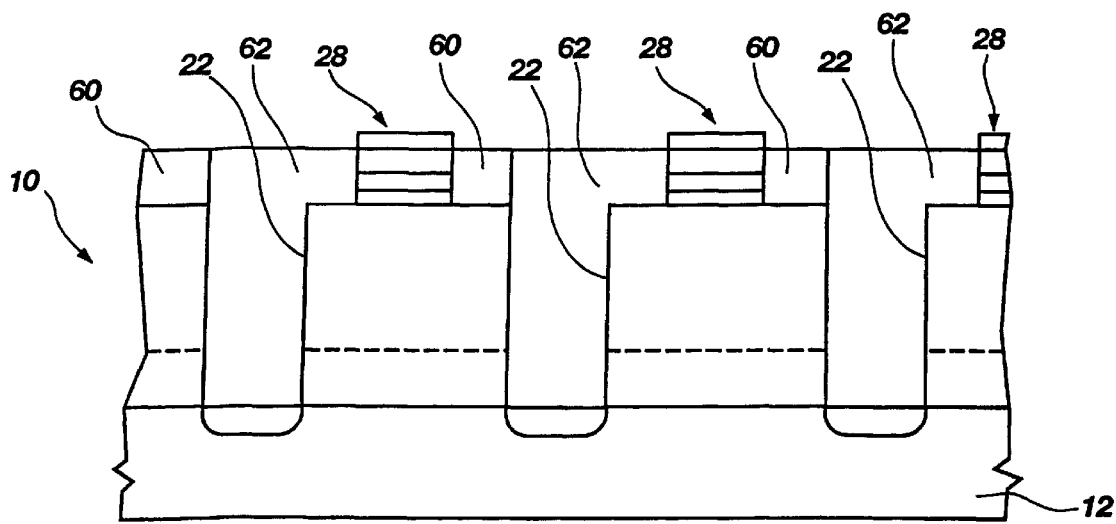

With reference to FIG. 13, mask 56 may be removed from semiconductor memory device 10 by known processes, such as by the use of solvents or heat, and semiconductor memory device 10 washed. Upon removing mask 56 from semiconductor memory device 10, cavities 62, which are defined by trenches 22, layer 60, and digit lines 28, are exposed.

Figure 14:
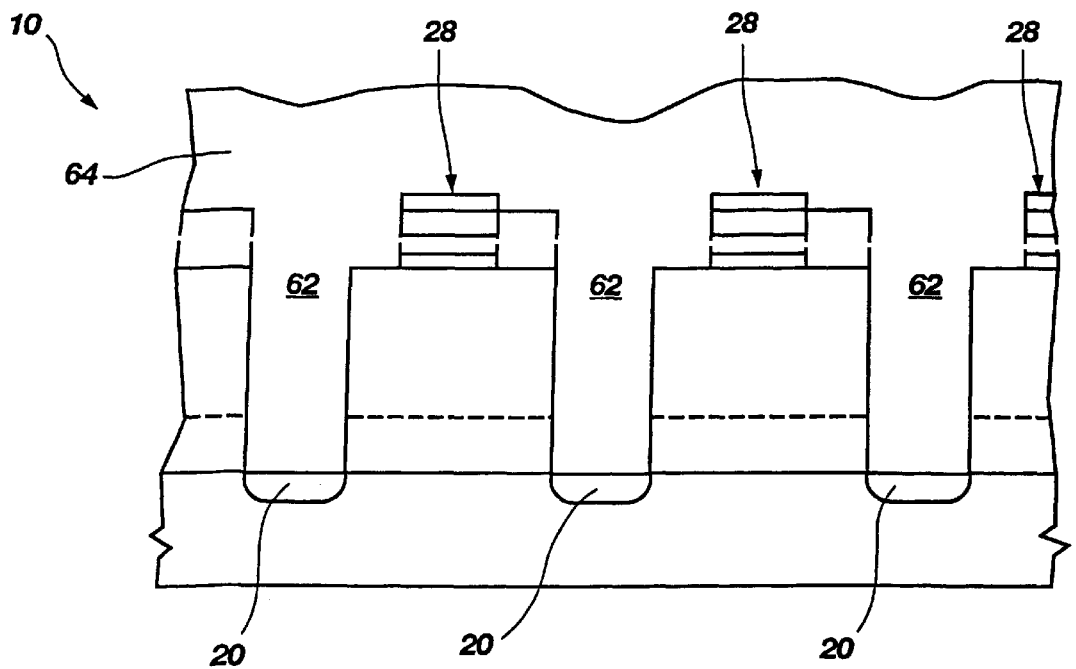

As shown in FIG. 14, upon disposing a layer 64 of conductive material over semiconductor memory device 10, cavities 62 are preferably substantially filled with the conductive material. Thus, the conductive material of layer 64 establishes an electrically conductive link between each bit contact 20 and its corresponding digit line 28. Layer 64 may be fabricated by known techniques, such as by physical vapor deposition (e.g., sputtering) or by chemical vapor deposition. Preferably, polysilicon is employed as the conductive material of layer 64.

Figure 15:
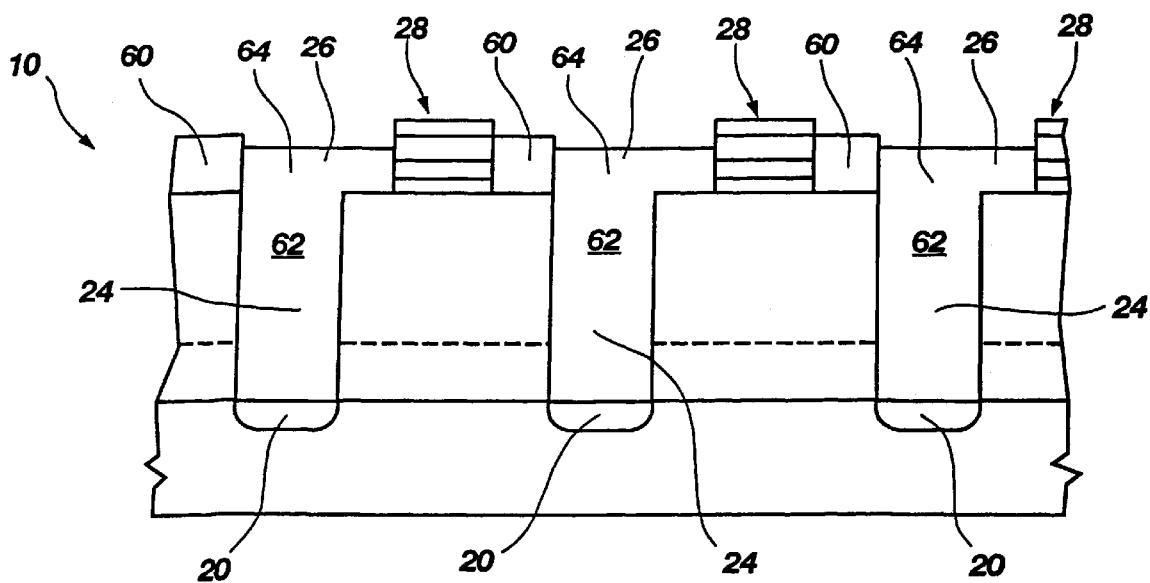

Referring to FIG. 15, the uppermost portions of layer 64 are preferably removed so as to substantially expose layer 60 through layer 64. Accordingly, the remaining portions of layer 64 are substantially confined within cavities 62 and define conductive plugs 24 and straps 26. The uppermost portions of layer 64 may be removed by known processes, such as by employing blanket isotropic etch-back techniques. Alternatively, another mask could be disposed over the semiconductor device and the plugs 24 and straps 26 defined through apertures thereof.

Figure 16:
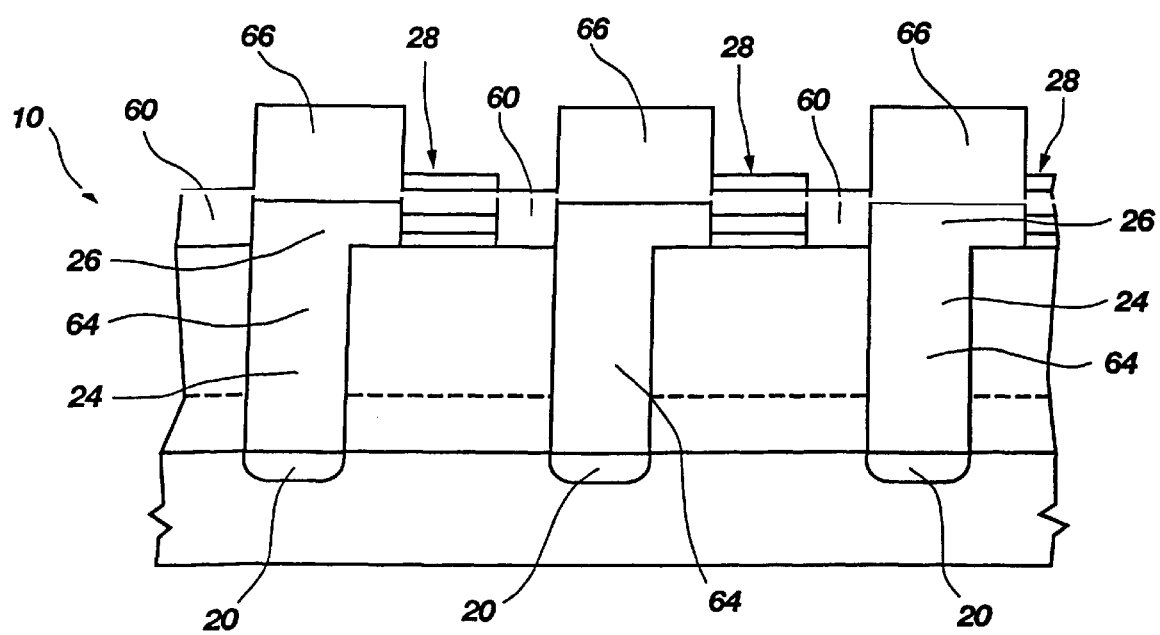

With reference to FIG. 16, yet another mask 66 may be disposed over semiconductor memory device 10. Mask 66 preferably shields the portions of layer 64 of conductive material that are disposed within cavities 62. Mask 66 may also shield digit lines 28. The remaining regions of semiconductor memory device 10 are preferably exposed through mask 66. Known processes may be employed to fabricate mask 66, such as the use of photomask techniques.

The regions of semiconductor memory device 10 that are exposed through mask 66 are preferably exposed to an anisotropic etchant in order to further define plugs 24 and straps 26 and to remove any stringers of the conductive materials employed in layers 42, 44, and 64 that may remain in these exposed regions. Preferably, an isotropic etchant is then employed to remove any remaining conductive materials that are exposed through mask 66. Accordingly, the use of both an anisotropic and an isotropic etchant is useful to substantially remove any stringers that may extend from or between plugs 24, straps 26, or digit lines 28 and that may cause electrical shorts in semiconductor memory device 10, while facilitating the fabrication of digit lines having a thickness of less than about 0.25 microns and a pitch of less than about 0.55 microns.

An insulative layer may then be disposed over plugs 24 and straps 26 by known processes. Other structures may also be fabricated over plugs 24, straps 26, and their corresponding digit lines 28, as known in the art.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method for interconnecting a contact of a semiconductor device structure to a corresponding conductive line of the semiconductor device structure, comprising:

substantially filling at least one trench in which the contact is located with a mask, said mask also contacting the corresponding conductive line;

forming an insulative structure at least laterally adjacent said mask;

removing at least a portion of said mask from said at least one trench so as to expose the contact therein; and introducing conductive material into said at least one trench, between the contact and the corresponding conductive line.

2. The method of claim 1, wherein said substantially filling said at least one trench comprises substantially filling said at least one trench with said mask comprising photoresist.

3. The method of claim 2, further comprising substantially curing said photoresist.

4. The method of claim 3, wherein said substantially curing comprises selectively exposing and developing selected regions of said photoresist.

5. The method of claim 3, further comprising hard-baking said photoresist.

6. The method of claim 1, wherein said forming said insulative structure comprises forming an insulative structure comprising tetraethylorthosilicate.

7. The method of claim 1, wherein said forming said insulative structure comprises chemical vapor depositing at least insulative material onto the semiconductor device structure.

8. The method of claim 1, wherein said forming said insulative structure includes planarizing a material of said insulative structure.

9. The method of claim 8, wherein said planarizing comprises at least abrasively polishing said material.

10. The method of claim 1, further comprising exposing said mask through said insulative structure.

11. The method of claim 10, wherein said exposing comprises removing at least portions of said insulative structure overlying said mask.

12. The method of claim 1, further comprising removing portions of a material of said conductive structure.

13. The method of claim 12, wherein said removing portions comprises forming a conductive strap corresponding to each contact and adjacent each corresponding conductive line.

14. The method of claim 12, wherein said removing portions comprises electrically isolating contacts of the semiconductor device structure from one another.

15. The method of claim 1, wherein said forming said insulative structure comprises electrically insulating at least a portion of the corresponding conductive line.

16. A method for fabricating at least one conductive line of a semiconductor device structure and interconnecting the at least one conductive line with at least one corresponding active device region of the semiconductor device structure, comprising:

forming a layer comprising conductive material over the semiconductor device structure;

defining at least one conductive line from said layer;

forming at least one trench in the semiconductor device structure so as to expose at least one active device region thereof;

substantially filling said at least one trench in which the at least one corresponding active device region is located with a mask, said mask also contacting the at least one conductive line;

forming an insulative structure at least laterally adjacent said mask;

removing at least a portion of said mask from said at least one trench so as to expose the at least one active device region therein; and introducing conductive material into said at least one trench, between the at least one conductive line and the at least one corresponding active device region.

17. The method of claim 16, wherein said forming said insulative structure comprises insulating at least portions of said at least one conductive line.

18. The method of claim 16, further comprising exposing said mask through said insulative structure.

19. A method for electrically interconnecting at least one active device region of a semiconductor device structure and a corresponding conductive line of the semiconductor device structure, comprising:

substantially filling at least one trench to which the at least one active device region is exposed with a mask, said mask also contacting the corresponding conductive line; and forming an insulative structure laterally adjacent to said mask.

20. The method of claim 19, further comprising removing at least portions of said mask from said at least one trench so as to expose at least a portion of the active device region exposed thereto.

21. The method of claim 20, further comprising introducing conductive material at least into said at least one trench so as to establish communication between the at least one active device region and the corresponding conductive line.

22. The method of claim 21, further comprising patterning the conductive material to form a conductive strap that extends between the at least one active device region and the corresponding conductive line.

* * * * *

UNITED STATES PATENT AND TRADEMARK OFFICE
CERTIFICATE OF CORRECTION

PATENT NO. : 6,555,463 B2  Page 1 of 1
APPLICATION NO. : 10/032730
DATED : April 29, 2003
INVENTOR(S) : Tyler A. Lowrey It is certified that error appears in the above-identified patent and that said Letters Patent is hereby corrected as shown below:

In the specification:

| | | |
|---|---|---|
| COLUMN 1, | LINE 8, | after "629," insert --issued Apr. 16, 2002,-- |
| COLUMN 4, | LINE 27, | change "device within" to --device and within-- and at the end of the line, delete "and" |
| COLUMN 4, | LINE 58, | delete "either" at the beginning of the line |

Signed and Sealed this

Twenty-ninth Day of August, 2006

JON W. DUDAS
*Director of the United States Patent and Trademark Office*